United States Patent [19]

Luryi

[11] Patent Number: 4,860,064
[45] Date of Patent: Aug. 22, 1989

[54] TRANSISTOR COMPRISING A 2-DIMENSIONAL CARRIER GAS COLLECTOR SITUATED BETWEEN EMITTER AND GATE

[75] Inventor: Sergey Luryi, Millington, N.J.

[73] Assignee: American Telephone and Telegraph Company AT&T Bell Laboratories, Murray Hill, N.J.

[21] Appl. No.: 111,387

[22] Filed: Oct. 21, 1987

[51] Int. Cl.[4] .............................................. H01L 29/76
[52] U.S. Cl. .......................................... 357/12; 357/4; 357/16
[58] Field of Search ................................. 357/4, 12, 16

[56] References Cited

U.S. PATENT DOCUMENTS 4,581,621 4/1986 Reed ........................................ 357/6
4,721,983 1/1988 Frazier .................................. 357/16

FOREIGN PATENT DOCUMENTS 8604184 7/1986 World Int. Prop. O. .

OTHER PUBLICATIONS

*Review of Modern Physics*, vol. 54, No. 2, Apr. 1982 "Electronic Properties of Two-Dimensional Systems" by T. Ando et al., pp. 437–458.
*Applied Physics Letters*, vol. 47(8), "Inverted Base-Collector Tunnel Transistors" by A. R. Bonnefoi et al., pp. 888–890 (1985).
*MOS Physics and Technology*, John Wiley & Sons, New York (1982) pp. 254–271.

*Primary Examiner*—William D. Larkins
*Attorney, Agent, or Firm*—Eugen F. Pacher

[57] ABSTRACT

A previously ignored property of a degenerate 2-dimensional gas of charge carriers in a quantum well (to be termed the quantum-capacitance effect) makes possible a novel class of transistors. In these devices the collector (a quantum well having high transverse conductance) is located between gate and emitter, with a barrier layer between emitter and collector, and a relatively thin barrier layer between collector and gate, and the chemical compositions and/or thicknesses of the various layers are chosen such that application of a voltage to the gate results, as a manifestation of the quantum-capacitance effect, in an induced charge in the emitter, whereby a current between emitter and collector can be controlled by means of a voltage applied to the gate. Transistors according to the invention potentially are very fast. Exemplarily the invention is embodied in a GaAs/AlGaAs heterostructure.

14 Claims, 2 Drawing Sheets

TRANSISTOR COMPRISING A 2-DIMENSIONAL CARRIER GAS COLLECTOR SITUATED BETWEEN EMITTER AND GATE

FIELD OF THE INVENTION

This invention pertains to the field of semiconductor devices, in particular, to heterojunction transistors.

BACKGROUND OF THE INVENTION

Almost since the invention of the transistor workers in the field have pursued the goal of greater and greater operating speed of such devices. The success of this endeavor has been spectacular, resulting in commercial devices capable of operation in the GHz regime. However, the quest continues unabated, and structures have been proposed that seem capable of substantially greater speed yet. Among such devices are transistors comprising a two-dimensional electron gas (2DEG) in a quantum well (QW) or an inversion layer. By a 2DEG we mean an assembly of electrons that are frozen in a quantized energy level for one spatial dimension but are free to move in the other two spatial dimensions. Exemplary of devices that comprise a 2DEG is the hot electron unipolar transistor disclosed in U.S. Pat. No. 4,691,215, incorporated herein by reference. For a review of the properties of a 2DEG, see, for instance, T. Ando et al., *Reviews of Modern Physics*, Vol. 54(2), page 437 (1982), (especially pp. 437–458), also incorporated herein by reference.

Even though a variety of potentially very high speed transistor designs are already known to the art, there exists still considerable interest in the discovery of novel approaches, especially approaches based on previously unrecognized phenomena or characteristics, since such novel devices may have advantages over prior art devices. In any case, the availability of a multiplicity of potential designs makes it easier for the device designer to pick a device most suitable for any given task.

Most transistors known to the prior art comprise a control region (base or gate) between a charge carrier emission region (emitter or source) and a charge carrier collection region (collector or drain). However, recently a transistor structure has been proposed that has a different arrangement of the three regions. In particular, the proposed transistor comprises an emitter that is separated from a collector only by a very thin potential barrier, with the collector being intermediate the emitter and the base. See, A. R. Bonnefoi et al, *Applied Physics Letters*, Vol. 47(8), pp. 888–890, (1985).

According to the published description of the above device, the collector region is a lightly doped n-type QW, separated from the base by a relatively thick lightly doped barrier layer. As can be seen from FIG. 1b of the reference, at equilibrium the Fermi level in the collector QW is substantially below the lowest energy state of the 2DEG. Application of an electric field between base and emitter is said to modify the positions of the sub-bands in the well with respect to the emitter Fermi level and thus modulates the tunneling current from the emitter into the collector QW. Because the operation of the prior art device depends on the modulation of the quasi-stationary states in the QW by the base electric field to produce transistor I-V characteristics, the prior art device is referred to as the Stark effect transistor.

SUMMARY OF THE INVENTION

It has been discovered that a quantum mechanical effect, associated with a two-dimensional conductive sheet, e.g., the degenerate electron gas in a QW or an inversion layer, makes possible a novel class of electronic devices that have, inter alia, the potential of high speed operation. Although in principle either electrons or holes can be the mobile charge carriers in a device according to the invention, the discussion herein will primarily be in terms of devices in which electrons are the mobile carriers.

It is a well known result of classical electromagnetic theory that a grounded conductive plate completely shields the quasi-static electric fields emanating from charges on one side of the plate from penetrating into the space beyond the plate. Thus, the prior art predicts that in a 3-plate capacitor 10 as is shown in FIG. 1, with a voltage V applied to plate 11 at node 1, and plates 12 and 13 grounded, the electric field $E_2$ in the region between plates 12 and 13 is zero. The space between plates 11 and 12, and between 12 and 13 is assumed to be filled with dielectric material 14 and 15, respectively, the former having thickness $d_1$ and dielectric constant $E_1$, and the latter $d_2$ and $E_2$.

Thus, classically the total capacitance per unit area C seen at node 1 of capacitor 10 is $C_1$, the geometrical capacitance per unit area associated with the capacitor formed by plates 11 and 12 ($C_1 = \epsilon_1/4\pi d_1$, and the corresponding geometrical capacitance associated with the capacitor formed by plates 12 and 13 is $C_2 = \epsilon_2/4\pi d_2$).

The situation is different in a 3-plate capacitor in which the central plate is a degenerate 2DEG. In this case, the field due to charges on plate 11 partially penetrates through the central conducting plate 12 and induces charges on plate 13. The total capacitance per unit area $C_{total}$ of the series combination as measured at node 1 is given by the equivalent circuit shown in FIG. 2, wherein capacitance $C_1$ and $C_2$ are identical to the above discussed classical (geometrical) capacitances, and the quantum capacitance per unit area $C_q$ has the value $4\pi g_v m e^2/h^2$. In this expression, $g_v$ is the valley degeneracy factor, m is the effective electron mass of the 2DEG in the direction perpendicular to its plane, and all the other symbols have their customary meaning. Thus defined, $C_q$ coincides with the so-called inversion-layer capacitance which arises in connection with the carrier-density fluctuations induced by interface charges in a metal-oxide-semiconductor system. See, for instance, E. H. Nicollian and J. R. Brews, *MOS Physics and Technology*, John Wiley & Sons, N.Y. (1982), especially page 270.

It can be shown that the above expression for $C_q$ is equivalent to $C_q = (6 \cdot 10^7 g_v m/m_o)$ cm$^{-1}$, wherein $m_o$ is the free electron mass. For instance, for an inversion layer on silicon (100) surface one has $g_v = 2$ and $m/m_o = 0.98$, so that the quantum capacitance $C_q > 10^8$ cm$^{-1}$. Inasmuch as the geometrical gate capacitance $C_{gate} = \epsilon_{oxide}/4\pi d_{oxide}$ is less than $10^6$ cm$^{-1}$ for any realistic oxide thickness, $C_q$, and parallel to it the depletion layer capacitance (which is typically small and takes the role of $C_2$ in FIG. 2), both drop out. Any capacitance measurement at the gate node of an MOS transistor structure in the strong inversion regime, therefore, produces only the geometrical capacitance, $C_1 = C_{gate}$. As shown below, the situation is quite different in semiconductors with low effective mass, high dielectric constant, and small thickness of barrier layers.

The partial penetration of an external field through a highly conducting 2DEG allows the implementation of a class of novel high-speed devices. In general, these devices comprise a relatively conductive first region (which will frequently be referred to as the "emitter"), a second region (frequently to be referred to as the "collector") separated from the first region by a relatively non-conductive first barrier region (which will frequently be referred to herein as the "emitter barrier"), and a relatively conductive third region (frequently to be referred to as the "gate") separated from the second region by a relatively nonconductive second barrier region (frequently to be referred to herein as the "gate barrier"). The inventive three-terminal devices further comprise means for making electrical contact to the emitter, the collector and the gate, respectively.

The chemical composition (including doping) and layer thicknesses of the inventive devices are selected such that a degenerate 2DEG can be formed in the second region by application of a voltage to at least one of the means for making electrical contact, e.g., the gate terminal, such that the second region acquires relatively low transverse resistance (typically less than about $10^3 \Omega$/square; a device having substantially larger transverse resistance typically has a too large RC time constant to be of interest). Typically the emitter layer is at least about 100 nm, the emitter barrier layer is between about 3 and 100 nm, the collector layer is between about 2 and 50 nm, the gate barrier layer is between about 5 and 10 nm, and the gate layer is at least about 100 nm thick.

Advantageously the second region is a quantum well. As is well known, associated with a QW are a multiplicity of sub-bands. Preferably the biasing conditions and the thickness of the QW are chosen such that the electron density in the 2DEG in the QW is such that the lowest sub-band is populated, with the higher sub-bands being essentially empty. This implies that the quasi-Fermi energy of the 2DEG is greater than $E_o$ (the lowest energy of the lowest sub-band) but less than $E_1$ (the lowest energy of the first higher sub-band). Furthermore, the chemical composition (including doping), and layer thicknesses of the inventive devices are selected such that application of voltage between the collector and the gate induces or modifies an electric field in the emitter barrier region, whereby a flow of current between emitter and collector can be responsive to an electrical signal applied to the gate terminal.

In preferred devices the two barrier regions and the QW therebetween are formed from essentially undoped semiconductor material. Use of an undoped QW is considered to be a significant aspect, since the absence of doping atoms in the QW results in reduced scatterng of the carriers therein and thus in enhanced lateral conductivity of the 2DEG, as compared to the prior art device of similar topology. Moreover, use of an undoped QW-plus-barrier structure eliminates all unwelcome effects associated with spatial fluctuations in the dopant concentration, and in particular ensures a greater uniformity of the current flow over the device area.

In a practical device it is desirable that the collector current be highly responsive to changes in the gate voltage. A measure of the "responsiveness" of the collector current to a change in the gate voltage is the "ideality factor" defined as $n = 1/(\partial \Phi_q / \partial V_G)$. Smaller n implies greater responsiveness. In this expression $\Phi_q$ is the electrostatic potential of the QW. The ideality factor is to be evaluated for fixed voltage on the QW and the emitter. It can be shown that for devices according to the invention $n = 1 + (C_q + C_2)/C_1$. In inventive devices n thus is always greater than 1, but preferably less than 10.

DETAILED DESCRIPTION OF SOME EXEMPLARY EMBODIMENTS

The novel principle of control, by means of the quantum capacitance effect, of charge flow between two regions that are separated by a relatively nonconducting region makes possible a new class of fast electronic devices. Some exemplary members of this new class of devices will now be described in detail.

Figure 1:
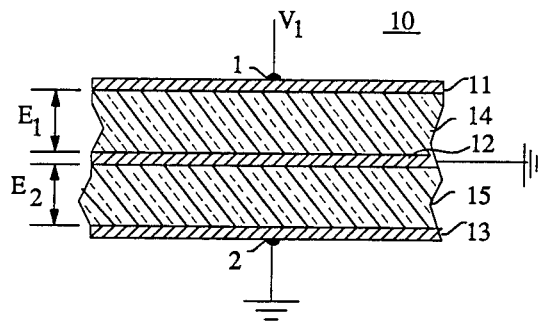
FIG. 1 schematically depicts a three-plate capacitor.
Figure 2:
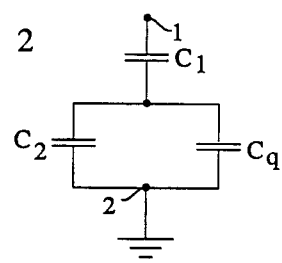
FIG. 2 shows the equivalent circuit of a three-plate capacitor in which the middle plate is a 2DEG.
Figure 3:
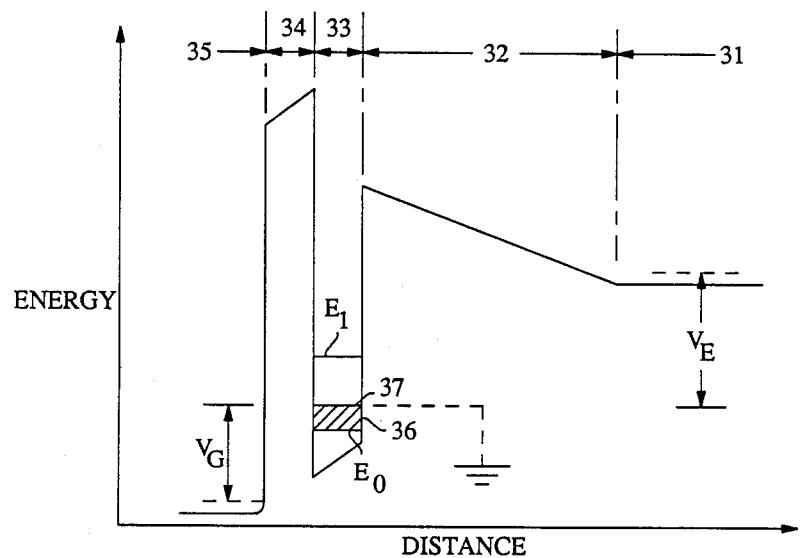
FIGS. 3 and 4 schematically show potential energy diagrams associated with two exemplary devices according to the invention.

In FIG. 3 are schematically depicted relevant aspects of the electronic structure of the first of the two exemplary devices. Such potential energy diagrams are well understood by those skilled in the art. The figure shows a degenerate n-type emitter region 31 followed by (typically undoped) emitter barrier region 32, which in turn is followed by (preferably undoped) quantum well region 33, (typically undoped) gate barrier region 34, and degenerate n-type gate region 35. Exemplarily such electronic structure can be attained in a GaAs/AlGaAs heterostructure, with gate, collector and emitter being GaAs, gate barrier region 34 being AlAs, and emitter barrier region 32 having composition $Al_xGa_{1-x}As$, with x being substantially 0 at the emitter interface and being about 0.5 at the interface with the quantum well. Barriers 34 and 32 have thickness $d_1$ and $d_2$, respectively. (Alternatively, the barrier 32 could be an undoped AlAs layer, and the emitter 31 could be a heavily doped n-AlAs layer). It will be understood that means for making electrical contact to the emitter, the collector, and the base are provided. FIG. 3 pertains to a device in common-collector configuration. It will be appreciated that this is exemplary only, and that inventive devices can be used in other configurations, in analogy with prior art three-terminal devices.

Application of an appropriate positive bias $V_G$ to the gate induces a 2DEG in the QW 33. The biasing preferably is such that the first sub-band of the QW is populated with electrons, with higher sub-bands being substantially empty. This is schematically indicated in FIG. 3, with numeral 36 indicating the filled electron states in the lowest sub-band, and 37 corresponding to the quasi-Fermi level of the electrons in the QW. Applying a negative voltage to the emitter terminal gives rise to a thermionic current from the emitter to the collector over the emitter barrier. Due to the penetration of the gate field through the degenerate 2DEG in the QW into the emitter barrier region the thermionic current will respond to changes in $V_G$, and thus can be controlled by means of an electrical signal applied to the gate terminal.

The mutual conductance $g_m$ of the inventive device (defined as $g_m = \partial J_c / \partial V_G |_{V_c = constant}$, where $J_c$ is the collector current density) is approximately equal to $eJ_c/nkT$, and is substantially proportional to the collector current so long as the $J_c(V_G)$ characteristic is exponential. In the above expression e, k and T have their customary meaning, and n is the previously defined ideality factor.

The small-signal transistor delay $\tau$ of the inventive device is greater than or equal to $\tau_{min}$, which is defined as $(C_{total}/g_m^{max}) = [(d_2/V_T)(1+C_q/C_2)]$, where $V_T = (kT/2\pi m)^{\frac{1}{2}}$ is the thermal velocity of carriers, and $d_2$, $C_q$, and $C_2$ have been defined previously. Assuming that $C_q = 4 \times 10^6 cm^{-1}$ (which is an exemplary value that may be applicable for a GaAs/AlGaAs heterostructure) and $d_2 = 30$ nm, $\tau_{min}$ is approximately 4 ps. The device speed of a device of the type depicted in FIG. 3 (a "thermionic" quantum-capacitance device) may be increased even further if a material with lower effective mass is used for the quantum well.

Figure 4:
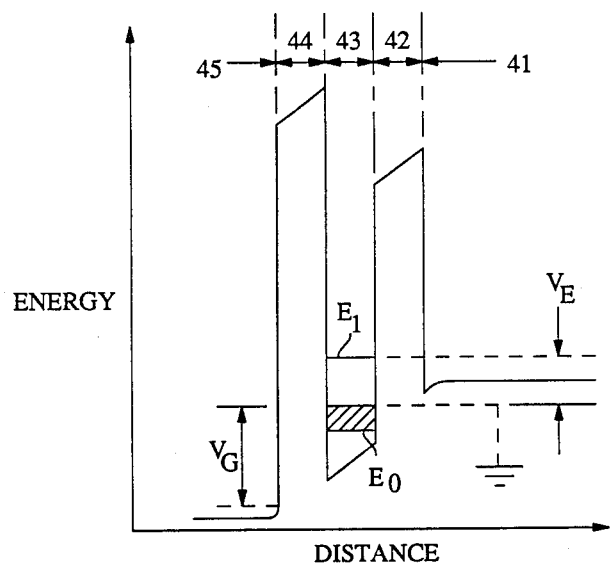

The relevant aspects of a second exemplary inventive device are schematically depicted in FIG. 4, in which the emitter, collector, and gate regions are identified by numerals 41, 43, and 45, respectively, and the emitter and gate barrier regions are identified by numerals 42 and 44, respectively. In an exemplary embodiment of the design, both the emitter and the gate are degenerate n-GaAs, and regions 42, 43, and 44 are essentially undoped material, with barriers 42 and 44 being $Al_xGa_{1-x}As$, (for example, x ~0.5) and AlAs, respectively, and quantum well 43 being GaAs. The thickness of barriers 42 and 44 is $d_2$ and $d_1$, respectively, with $d_2$ being exemplarily about 3 nm, and $d_1$ about 6 nm. The device can also be embodied in other heterostructures, as will be appreciated by those skilled in the art.

Application of an appropriate positive gate voltage $V_G$ between collector and gate induces a degenerate 2DEG in the QW, preferably partially filling the lowest sub-band, with higher sub-bands being essentially empty. applying an appropriate negative emitter bias $V_E$ results in tunneling of electrons from the emitter to the collector, with characteristics typical of a quantum well diode. The characteristics are again controlled by the quantum-capacitance effect.

The effectiveness of the gate control depends on the previously discussed ideality factor n. The transconductance characteristic is expected to be similar to the I-V characteristic of a symmetric double-barrier resonant-tunneling diode (with barriers of thickness $d_2$), provided the voltage axis is scaled by n/2. It may be noted that, since the lower sub-band $E_o$ is occupied, tunneling occurs mainly into the states of the upper sub-band $E_1$. The device will exhibit a negative transconductance, and may therefore have important applications in future logic circuits. The use of a material having smaller effective electron mass than GaAs for the QW may result in further improved performance of the device.

Figure 5:
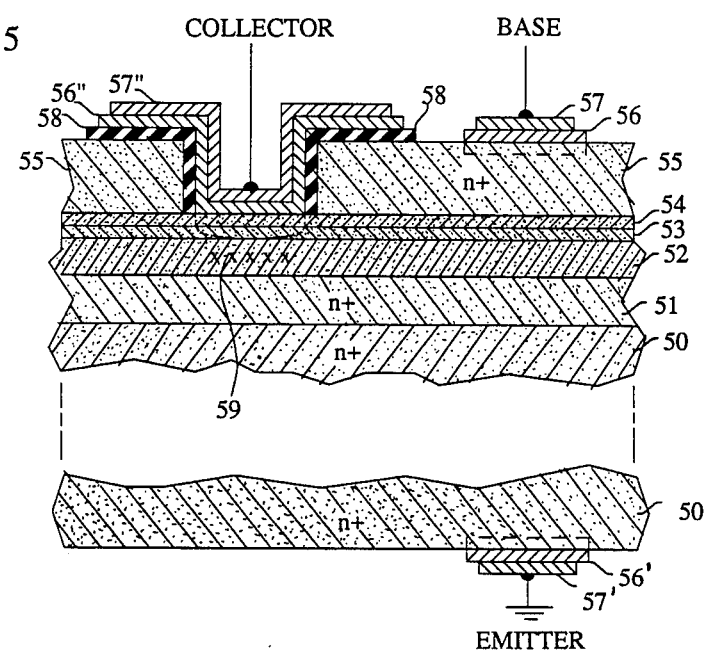
FIG. 5 schematically depicts an exemplary transistor according to the invention.

Exemplarily an inventive device (having a potential energy distribution similar to that shown in FIG. 3) is embodied in a structure such as is schematically depicted in FIG. 5. The exemplary device is implemented in the common emitter configuration, with the emitter contact being provided through highly conducting n+GaAs substrate 50 (e.g., doped with $2 \times 10^{18}$ Si donors/$cm^3$), upon which is disposed similarly highly conductive n+emitter layer 51. Layer 51 typically is of thickness greater than about 100 nm. Upon layer 51 is disposed the undoped emitter barrier layer 52 ($Al_xGa_{1-x}As$, with composition varying from x=0 at the emitter interface to x ~0.5 at the QW interface), of thickness $d_2$ typically between about 3 and 100 nm, preferably less than about 50 nm. Disposed on layer 52 is undoped collector layer 53 (exemplarily GaAs) having a thickness of about 5 nm, typically less than about 50 nm (to avoid an unnecessary decrease in $C_2$) and more than about 2 nm (to avoid undesirable effects due to fluctuations in the well width). Upon the collector layer is disposed undoped gate barrier layer 54 (exemplarily AlAs) of thickness $d_1$ between about 5 and 10 nanometers. The thickness $d_1$ desirably is as small as possible, consistent with the requirement that there be no substantial gate leakage due to tunneling through the gate barrier. The upper limit is set by the need to maximize $C_1$ so as to make its value comparable to $C_q$. The level of any donor or acceptor impurities in layers 52-54 preferably is less than about $10^{16} cm^{-3}$, in order not to degrade the potential barriers and/or to result in high lateral conductivity of the 2DEG.

Upon the collector barrier layer is disposed a layer 55 of n+GaAs having a thickness of about 100 nm or larger and an excess donor concentration of at least about $2 \times 10^{18} cm^-$. As is appreciated by those skilled in the art, the above described structure is heteroepitaxial, with the crystal structure being continuous across all the interfaces. Such heterostructures can be produced by known methods, for instance, by molecular beam epitaxy (MBE), or by metal organic chemical vapor deposition (MOCVD).

Electrical contacts to gate layer 55 and substrate 50 (and therfore to emitter 51) are made in known manner by means of gold-germanium-silver alloy layer 56 and 56', respectively, overlaid with gold layer 57 and 57', respectively. External electrical access to collector layer 53 is provided by etching a window through layer 55 by a standard GaAs etching technique (layer 54 acts as an etch stop), deposition of conformal insulator 58 (e.g., silicon nitride), etching a window through the insulator, and forming Au/GeAg alloy layer 56" and Au layer 57" in a known manner. Appropriate heat treatment of such a structure results in diffusion of constituents of the alloy layers into the underlying semiconductor, and formation of ohmic contacts in a known manner. In order to insure adequate isolation between emitter and collector it may be desirable to increase the resistivity of the emitter barrier material 59 that underlies the collector contact. This can, for instance, be done by means of an oxygen implant, resulting in a high resistivity region (schematically indicated by means of crosses in FIG. 5). The implant is preferably carried out before metallization of the collector contact. Layer thicknesses and other features of FIG. 5 are not drawn to scale.

The transistor of FIG. 5 can be fabricated by known semiconductor processing techniques that include, in addition to, MBE or MOCVD, photolithography, wet and/or dry etching, and heating to form ohmic contacts. As known in the art, external electrical circuitry (not shown) can be attached to the completed device to complete an electrical circuit in which the transistor operates, e.g., as a switching device.

Another exemplary embodiment of the invention resembles the embodiment that is schematically depicted in FIG. 5, except that the transistor is in the common gate configuration, with the gate layer disposed on a highly conductive substrate, and the other layers are arranged accordingly. In this device a resistivity-increasing implant may frequently not be necessary.

The invention has been described in terms of several specific embodiments, but is not so limited. Not only can the quantum capacitance effect be used in other device configurations, but the invention can be embodied in material systems other than the GaAs/AlGaAs system. For instance, InGaAs/InAlAs heterostructures may be advantageous because of the lower electron effective mass in a InGaAs QW, compared to GaAs. For the same reason, one may use advantageously the II-VI (mercury-cadmium telluride) heterojunction systems. In principle, the gate barrier layer does not have to be implemented in a single-crystal semiconductor heterostructure; it may be possible to use a structure that comprises thin dielectric films and an insulated metal gate (IG) structure. Such a technology is not at hand presently, except for the celebrated silicon MOS, which is currently considered to be an unlikely candidate in the context of the present invention, due to the heavy electron mass and the valley degeneracy in Si. However, if a suitable insulated gate (IG) technology matures, it will be obvious to those skilled in the art how to implement a quantum capacitance transistor in such technology. Especially advantageous are considered to be IG systems with a high-permittivity dielectric (e.g., the oxides of magnesium or hafnium) on a low electron mass semiconductor material. Furthermore, it will be understood that, at least in principle, reciprocal structures are possible in which the mobile charge carriers are holes instead of electrons.

What is claimed is:

1. A transistor comprising
   (a) a relatively conductive first semiconductor layer;
   (b) a second semiconductor layer, separated from the first layer by a relatively non-conductive first semiconductor barrier layer;
   (c) a relatively conductive third layer, separated from the second layer by a relatively non-conductive second barrier layer, the first, second, and third layers to be referred to as emitter, collector, and gate layers, respectively, and the first and second barrier layers to be referred to as emitter barrier and gate barrier layers, respectively;
   (d) a separate electrical contact to each of the emitter, collector, and gate layers; wherein
   (e) the chemical composition and/or thickness of each of the emitter, collector, gate, emitter barrier and gate barrier layers are chosen such that the collector layer forms a quantum well with which is associated a lowest sub-band and at least one higher sub-band, such that a 2-dimensional "gas" of mobile charge carriers can be formed in the quantum well by application of a first bias voltage to at least one of the electrical contacts, and such that application of a second bias voltage can result in a current between emitter and collector layers, to be termed the collector current;
   CHARACTERIZED IN THAT
   (f) the chemical composition and/or thickness of each of the emitter, collector, gate, emitter barrier and gate barrier layers are furthermore chosen such that application of a voltage between gate and collector induces an electrical charge in the emitter layer such that the collector current can be responsive to the voltage applied between gate and collector, and
   (g) the thickness $d_1$ of the gate barrier layer is at most about 10 nm.

2. The transistor of claim 1, wherein each of the gate layer and the gate barrier layer is a semiconductor layer.

3. The transistor of claim 2, wherein at least the collector layer is substantially undoped and has a lateral resistivity of less than about $10^3$ ohms/square when the collector contains the 2-dimensional gas of mobile charge carriers.

4. The transistor of claim 3, wherein the 2-dimensional gas of mobile charge carriers is a 2-dimensional electron gas.

5. The transistor of claim 4, wherein the density of electrons in the quantum well is such that the lowest sub-band is at least partially filled and such that the at least one higher sub-band is substantially empty.

6. The transistor of claim 4, wherein both the emitter and the gate layer comprise n-type GaAs, wherein each of the emitter barrier, collector, and gate barrier layer comprise essentially undoped material, with the emitter barrier layer comprising aluminum gallium arsenide, the collector layer comprising GaAs, and the gate barrier layer comprising AlAs.

7. The transistor of claim 4, wherein the emitter barrier layer consists substantially of $Al_xGa_{1-x}As$, with x being approximately zero at the boundary between the emitter layer and the emitter barrier layer and increasing continuously towards the boundary between the emitter barrier layer and the collector layer, and wherein the chemical composition and/or thickness of the emitter barrier layer are chosen such that the collector current is substantially a thermionic current.

8. The transistor of claim 4, wherein the chemical composition and/or thickness of the emitter barrier layer are chosen such that the collector current is substantially a tunneling current.

9. The transistor of claim 1, wherein the gate barrier layer consists substantially of insulator material.

10. The transistor of claim 1, wherein the gate layer consists substantially of metal.

11. The transistor of claim 9, wherein the gate layer consists substantially of metal.

12. A transistor structure comprising in succession:
   (a) a semiconductor emitter layer;
   (b) an essentially undoped semiconductor emitter barrier layer;
   (c) an essentially undoped semiconductor collector layer that forms a quantum well;
   (d) an essentially undoped semiconductor gate barrier layer; and
   (e) a semiconductor gate layer; the transistor structure further comprising
   (f) a separate electrical contact to each of the emitter, collector, and gate layers; wherein the chemical composition and/or thickness of each of the layers is selected such that
   (g) a 2-dimensional electron gas can be formed in the quantum well by application of a first bias voltage to at least one of the electrical contacts; and such that the application of a second bias voltage can result in a current between emitter and collector, to be termed the collector current;
   CHARACTERIZED IN THAT
   (h) the chemical composition and/or thickness of each of the layers furthermore are selected such that application of a voltage between gate and collector induces an electrical charge in the emitter such that the collector current can be responsive to the voltage applied between gate and collector, and (i) the thickness of the gate barrier layer is atmost about 10 nm.

13. The transistor of claim 1 wherein the emitter barrier layer, the collector layer, and the gate barrier layer each have a carrier concentration of less than about $10^{16}$ cm$^{-3}$.

14. The transistor of claim 1 wherein $d_1$ is chosen such that $C_1$ is approximately equal to $C_q$, where $C_q$ is the quantum capacitance per unit area associated with the 2-dimensional carrier gas.

* * * * *